United States Patent
Velez et al.

[11] Patent Number: 6,163,572
[45] Date of Patent: Dec. 19, 2000

[54] METHOD OF REDUCING COEFFICIENT LEAKAGE NOISE INTRODUCED TO AN EQUALIZER DURING STEADY STATE OPERATION

[75] Inventors: Edgar Velez, Kanata; Ian Dublin, Ottawa, both of Canada; Richard Buz, Rohnert Park, Calif.; Sisay Yirga, Nepean, Canada

[73] Assignee: Nortel Networks Limited, Montreal, Canada

[21] Appl. No.: 09/069,436

[22] Filed: Apr. 29, 1998

[51] Int. Cl.$^7$ ........................................ H03H 7/30
[52] U.S. Cl. ........................... 375/229; 375/232; 708/323
[58] Field of Search ........................ 375/229, 230, 375/231, 232, 233, 234; 333/166; 708/322, 323

[56] References Cited

U.S. PATENT DOCUMENTS

| | | | |
|---|---|---|---|
| 4,243,959 | 1/1981 | Duttweiler | 333/166 |
| 4,467,441 | 8/1984 | Gritton | 708/322 |
| 4,575,857 | 3/1986 | Murakami | 375/230 |
| 5,541,956 | 7/1996 | Ueda | 375/232 |
| 5,661,753 | 8/1997 | Iemura | 375/233 |
| 5,689,528 | 11/1997 | Tsujimoto | 375/233 |
| 5,694,423 | 12/1997 | Larsson et al. | 375/231 |
| 5,937,007 | 8/1999 | Raghunath | 375/232 |

*Primary Examiner*—Stephen Chin
*Assistant Examiner*—Chieh M. Fan
*Attorney, Agent, or Firm*—Pearne & Gordon LLP

[57] ABSTRACT

A method of reducing leakage noise introduced to an equalizer in a modem during steady state operation. The equalizer includes forward and feedback filters represented by tap coefficients. The tap coefficients of the filters are updated using least mean squares adaptation equations at a symbol rate during steady state operation. The method of the invention includes the steps of: (a) reducing the absolute value of the updated tap coefficients of the filters at a prescribed rate that is less than the symbol rate. Long term convergence stability is improved and leakage noise is reduced by leaking the filter coefficients less frequently than the symbol rate.

17 Claims, 5 Drawing Sheets

METHOD OF REDUCING COEFFICIENT LEAKAGE NOISE INTRODUCED TO AN EQUALIZER DURING STEADY STATE OPERATION

FIELD OF THE INVENTION

This invention relates to the field of modems and in particular to methods of reducing coefficient leakage noise introduced to an equalizer during steady state operation.

BACKGROUND OF THE INVENTION

In communication systems a modem is used to convert (modulate) digital signals generated by a computer into analog signals suitable for transmission over telephone lines. Another modem, located at the receiving end of the transmission, converts (demodulates) the analog signals back into digital form. In a particular modulation transmission scheme, the phase and amplitude of a signal are shifted to various combinations of values, each combination indicating a different set of transmitted bits. At the receiver, proper decoding includes detecting the various phase and amplitude combinations. In a two dimensional modulation scheme, the signal can be represented mathematically with an I (in-phase) component and a Q (quadrature-phase) component of the signal, each of which is $\pi/2$ out of phase with respect to the other. The plot of these two components on a two dimensional graph for a set of received symbols results in a pattern referred to as a constellation.

Proper detection of the I and Q components of the signal is hampered by various sources of signal degradation. One such source is intersymbol interference where consecutive transmitted symbols interfere with each other. Other sources of signal degradation include the transmission media (i.e. wire) and analog filters. These factors produce large amplitude and group delay distortion in the signal that needs compensation.

To compensate for intersymbol interference (ISI) and other sources of signal degradation and distortion, best performance is achieved by implementing an equalizer as a fractionally spaced adaptive filter. An adaptive filter can modify from time instant to time instant, the coefficients, also referred to as tap weights, used in the filter to remove ISI and to compensate for amplitude and group delay distortions. The update of the tap weights is done to minimize the error at the output of the filter. This error is effectively a measure of the difference between the actual output of the filter and the expected output. The adaptive process continues until the error is at a minimum (i.e. the filter converges).

The convergence of an equalizer depends on many factors including initial tap weights, desired convergence rate, signal to noise ratio (SNR) at the input and phase changes caused by a clock recovery circuit at the receiver, and can be accomplished with various adaptive algorithms.

The adaptation of the tap weights in adaptive equalizers is based on an assumed correct decision about which symbol was received. This assumption is valid for equalizers with a training sequence for which the received symbol is in fact known in advance. Equalizers, however, are also used without the benefit of a training sequence, in which case the decision is not necessarily correct. These equalizers are referred to as blind equalizers. The term blind refers to trying to find the correct equalizer coefficients without a reference training sequence, therefore during convergence the decisions may be incorrect and the coefficients (weights) erroneously updated. Although the possibility of a mistake exists, if the blind equalizer makes correct decisions for a sufficiently large set of received symbols, the equalizer will converge correctly.

After a filter has been equalized (i.e. filter coefficients have reached a converged value) a known technique, called coefficient leakage, is performed to attempt to ensure stable long term operation of the modem in a fixed-point digital signal processing (DSP) implementation. Coefficient leakage is accomplished by subtracting one least significant bit (LSB) from the magnitude of each coefficient in the filters of the equalizer at the symbol rate (or at the coefficient update rate). Although this small correction improves stability of convergence it also introduces additional noise to the equalizer.

SUMMARY OF THE INVENTION

An object of the present invention is to provide a method of coefficient leakage that improves long term stability of an equalizer and limits introduced noise.

In accordance with an aspect of the present invention there is provided a method of reducing leakage noise introduced to an equalizer during steady state operation, said equalizer having a forward filter represented by a plurality of tap coefficients and a feedback filter represented by a plurality of tap coefficients, said forward and feedback tap coefficients being updated at a symbol rate during steady state operation, the method comprising the steps of: (a) reducing the absolute value of one of the updated tap coefficients of the forward filter; (b) reducing the absolute value of one of the updated tap coefficients of the feedback filter; and (c) repeating steps (a) and (b) at a prescribed rate that is less than the symbol rate.

In accordance with another aspect of the present invention there is provided a method of reducing leakage noise introduced to an equalizer during steady state operation, said equalizer having a forward filter represented by a plurality of tap coefficients and a feedback filter represented by a plurality of tap coefficients, said forward and feedback tap coefficients being updated at a symbol rate during steady state operation, the method comprising the steps of: (a) reducing the absolute value of the updated tap coefficients of the forward filter; (b) reducing the absolute value of the updated tap coefficients of the feedback filter; and (c) repeating steps (a) and (b) less frequently than the symbol rate.

In accordance with another aspect of the present invention there is provided a method of reducing leakage noise introduced to an equalizer during steady state operation, said equalizer having a filter represented by a plurality of N-bit tap coefficients, said tap coefficients being updated at a symbol rate during steady state operation, the method comprising the steps of: (a) leaking the magnitude of the tap coefficients of the filter by one least significant bit; and (b) repeating step (a) once every M symbols where M is an integer greater than one.

In accordance with another aspect of the present invention there is provided a method of leaking an N-bit tap coefficient of a filter in an equalizer during steady state operation operating at a symbol rate, the method comprising: (a) leaking one least significant bit of the tap coefficient which introduces noise; and (b) repeating step (a) less frequently than the symbol rate by a factor of M to reduce the noise of step (a) at a level of an $N+\log_2 M$ bit coefficient.

BRIEF DESCRIPTION OF THE DRAWINGS

The present invention will be described in conjunction with the drawings in which.

DETAILED DESCRIPTION OF EMBODIMENTS OF THE INVENTION

Figure 1:
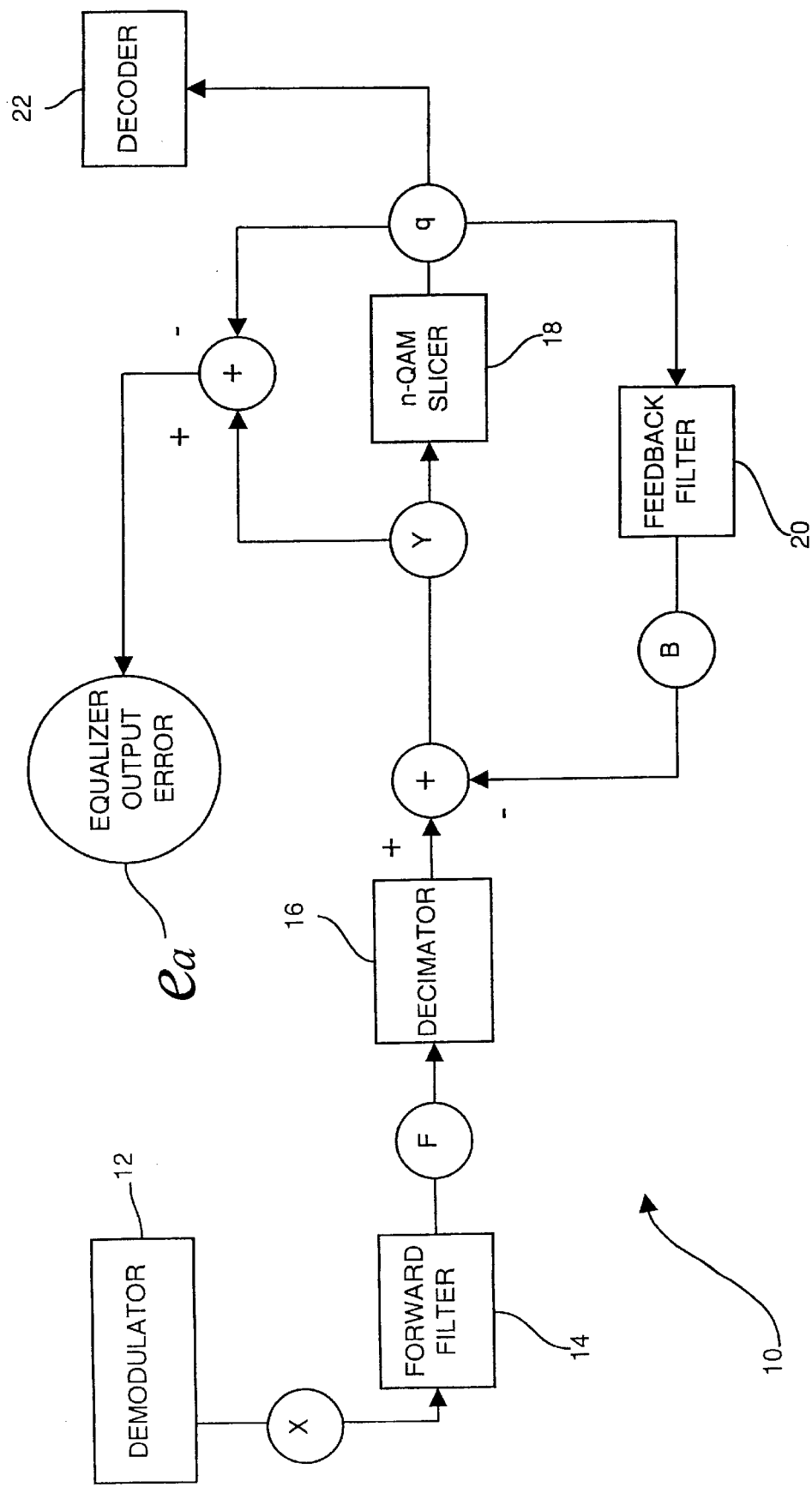
FIG. 1 is a block diagram of an adaptive decision feedback equalizer.

An equalizer 10, shown in FIG. 1, is used to counteract effects of amplitude and phase distortion introduced by a channel and analog front end of a receiver in a modem. The input X=I+jQ to the equalizer 10 is a complex input taken from the output of Nyquist filters located in a demodulator 12, which is first downsampled by a factor of 2 to provide in-phase (I) and quadrature (Q) datastream signals at twice the symbol rate (symbol rate=inverse of the baud rate of the modem).

The input X is passed through a complex-valued forward filter 14 to produce an output F. The output F of the forward filter 14 is downsampled by decimator 16 by a factor of 2, resulting in a symbol rate data sequence. Quantized output q from an n-QAM slicer 18 is used as input to a complex-valued feedback filter 20 to produce an output B. The output B of the feedback filter 28 is subtracted from the downsampled output (decimated) of the forward filter 14 resulting in an equalized signal Y.

The equalized signal Y is then passed through the n-QAM slicer 18, that quantizes each data sample (for each signal component I and Q of X) to a discrete symbol level in a constellation. The constellation represents a plot of the in-phase (I) component and the quadrature (Q) component of the input signal X on a two dimensional graph for a set of received symbols.

An error signal $e_a = Y - q_n$ is defined as the difference between the equalized signal Y and the quantized output q from the slicer 18. The error ea is used to update tap coefficients of the forward filter 14 and the feedback filter 20 once per symbol duration (also termed the symbol rate). The quantized output q of the slicer 18 is also sent to a symbol decoder 22 to recover raw data.

The operation of the forward filter 14 is described by the equation:

$$F(t) = \sum_{i=1}^{M} C_{fi} X(t - i) \quad \text{Eq. 1}$$

where F(t) represents the complex-valued output of the filter 14 at time t, X(t) is the complex-valued input to the filter 14 at time t, and $C_{fi}$ are the complex-valued filter coefficients (also termed the tag coefficients) for the filter 14. The complex-valued data F(t) is composed of an in-phase (I) component and an quadrature (Q) component.

The operation of the feedback filter 20 is described by the equation:

$$B(t) = \sum_{i=1}^{N} C_{bi} q(t - 1 - i) \quad \text{Eq. 2}$$

where B(t) represents the complex-valued output of the filter 20 at time t, $C_{bi}$ are the complex-valued feedback filter coefficients for the filter 20, and q(t) is the quantized output of the slicer 18 at time t.

The slicer 18 accepts the signal Y (representing the I and Q components of the equalized signal) and makes a decision as to which QAM symbol is actually received. In order to quantize the signal to the appropriate level in a constellation, the slicer 18 has a pair of control bits which specify the level of QAM constellation being used.

The tap coefficients of the forward and feedback filters are updated using the following equations, which are the least mean squares (LMS) adaptation equations:

Tap updates for forward filter 14

$$C_{fi} = C_{fi-1} + (\mu_f)(e_a)(X) \quad \text{Eq. 3}$$

where
  $C_{fi}$ represent the tap coefficients of the forward filter 14
  $\mu_f$ represents an adaptation rate variable used to update the tap coefficients of the forward filter 14
  $e_a$ represents the complex error for a given QAM index (n) and is defined as $e_a = Y - q_n$
  X represents the complex input signal (I+jQ)

Tap updates for feedback filter 20

$$C_{bi} = C_{bi-1} + (\mu_b)(e_a)(X) \quad \text{Eq. 4}$$

where
  $C_{bi}$ represent the tap coefficients of the feedback filter 20
  $\mu_b$ represents an adaptation rate variable used to update the tap coefficients of the feedback filter 20
  $e_a$ represents the complex error for a given QAM index (n) and is defined as $e_a = Y - q_n$
  X represents the complex input signal (I+jQ)

The filter coefficients $C_{fi}$ and $C_{bi}$ are continually updated after convergence to adjust for slow variations in wire loss, as well as variations introduced by other circuit components (e.g. timing recovery).

However, if the filter coefficients are not leaked (i.e. their magnitude decreased very slightly) the filter coefficient values will slowly (typically in hours or days) increase from the converged value and eventually cause the equalizer 10 to diverge, which will then require a reconvergence operation. The difference between leaking and not leaking filter coefficients is shown in the graph of FIG. 2.

The graph plots filter coefficient value as a function of symbol count (i.e. time). When the filter coefficients are updated using only Eqs. 3 and 4 a dotted line graph 30 shows that the coefficient values slowly increase from a converged value (CV). Eventually the increasing coefficient value will cause misconvergence of the equalizer 10.

Figure 2:
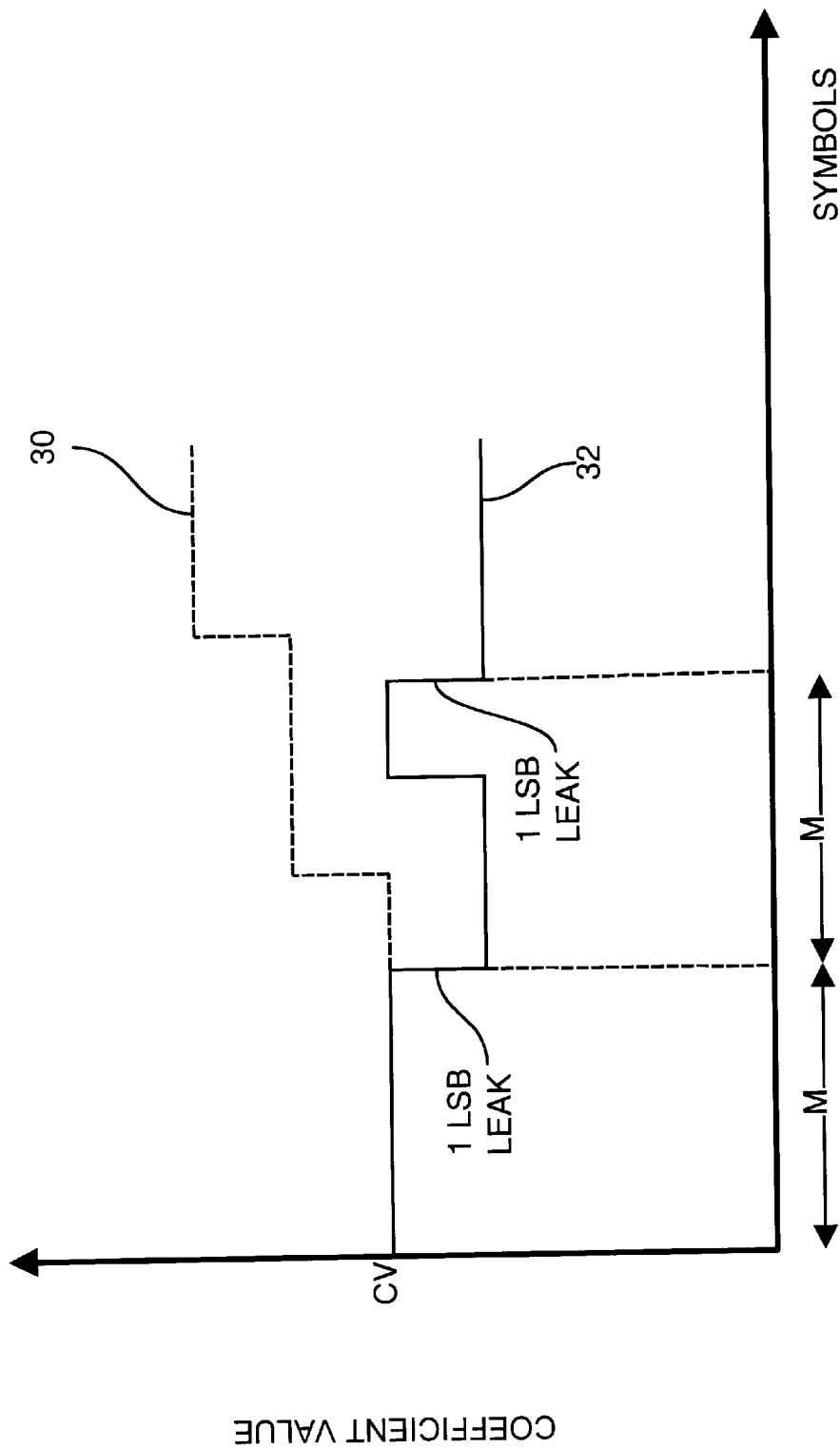
FIG. 2 represents a graphical illustration of coefficient value plotted against symbol count (time) for an equalizer that does not leak filter coefficients and for an equalizer that leaks filter coefficients according to the present invention.

To ensure long term stability of a converged equalizer 10 the tap coefficients $C_{fi}$ and $C_{bi}$ are updated using Eqs. 3 and 4 and are leaked according to a coefficient leakage method of the present invention as illustrated by a solid line graph 32 of FIG. 2.

Coefficient leakage of the present invention reduces the absolute value of the tap coefficients $C_{fi}$ and $C_{bi}$ of the filters 14 and 20 by subtracting 1 LSB (if tap coefficient is positive) or by adding 1 LSB (if the tap coefficient is negative) as defined by equations Eq. 5 and 6.

Leakage of coefficients for forward filter 14

$$C_{fi}=C_{fi}-\Delta \cdot \text{sign}(C_{fi}) \qquad \text{Eq. 5}$$

where $\Delta=1$ LSB

Leakage of coefficients for feedback filter 20

$$C_{bi}=C_{bi}-\Delta \cdot \text{sign}(C_{bi}) \qquad \text{Eq. 6}$$

where $\Delta=1$ LSB

The leakage of the filter coefficients $C_{fi}$ and $C_{bi}$ using Eqs. 5 and 6 are performed less frequently (i.e. every M symbols) than the coefficient update rate (or symbol rate) to reduce the leakage introduced noise to a nondetectable level while still ensuring long-term stability. The combined effect of updating (using Eq. 3) and leaking (using Eq. 5) the forward filter 14 coefficients is illustrated in a forward filter update block diagram 40 shown in FIG. 4A. The combined effect of updating (using Eq. 4) and leaking (using Eq. 6) the feedback filter 14 coefficients is illustrated in a feedback filter update block diagram 42 shown in FIG. 4B.

Figure 3:
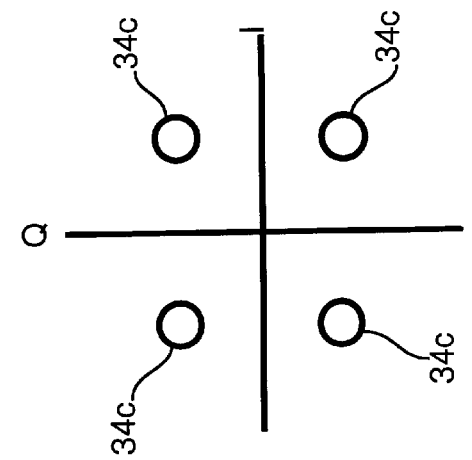
FIG. 3 represent a series of 4 QAM constellation maps (I versus Q) illustrating (A) an ideal converged constellation with frozen filter coefficients; (B) a converged constellation where the filter coefficients are leaked every symbol according to the prior art, and (C) a converged constellation where the filter coefficients are leaked every M symbols according to the present invention.
Figure 3:
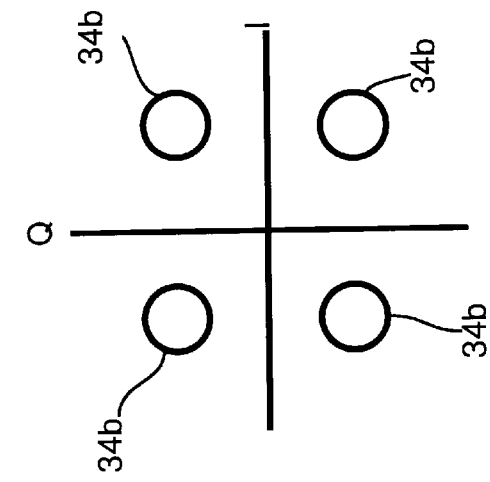
Figure 3:
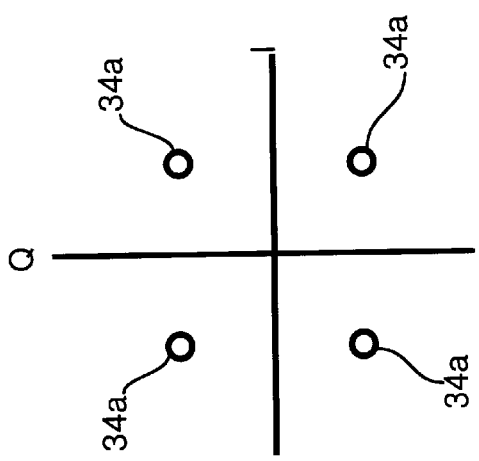

The effect of the coefficient leakage method of the present invention, represented by the update diagrams 40 and 42, is illustrated in a series of constellation maps in FIG. 3. Constellation map (A) illustrates an ideal 4 QAM map (consisting of four points 34a) with frozen/fixed filter coefficient values. The map (B) illustrates the effect of traditional filter coefficient leakage that is performed once per symbol. The filter coefficient values blur/vary considerable as represented by their effect on the constellation points 34b. The blurred constellation (B) is undesirable since it will reduce the signal-to-noise ratio and therefore the achievable bit error rate.

The map (C) illustrates the effect of filter coefficient leakage according to the present invention. Since the coefficient leakage (Eqs. 5 and 6) of the filters 14 and 20 are performed every M symbols (as opposed to every symbol) the filter coefficient blur is reduced to produce a long term stable equalizer 10 as represented by points 34c. The diameter of the points 34a, 34b, 34c in the constellations are representative of blur caused by the variation in coefficient values and are not drawn to scale.

The coefficient leakage method of the present invention is equivalent to introducing a prescribed amount of noise as if the coefficients had more precision (i.e. a greater number of bits). In particular, for a coefficient with N bits a leakage of 1 LSB every M symbols is equivalent to introducing noise at the level of a (N+$\log_2$M) bit coefficient. The effect is the same as subtracting a fraction of a bit at the normal coefficient update rate.

Figure 5:
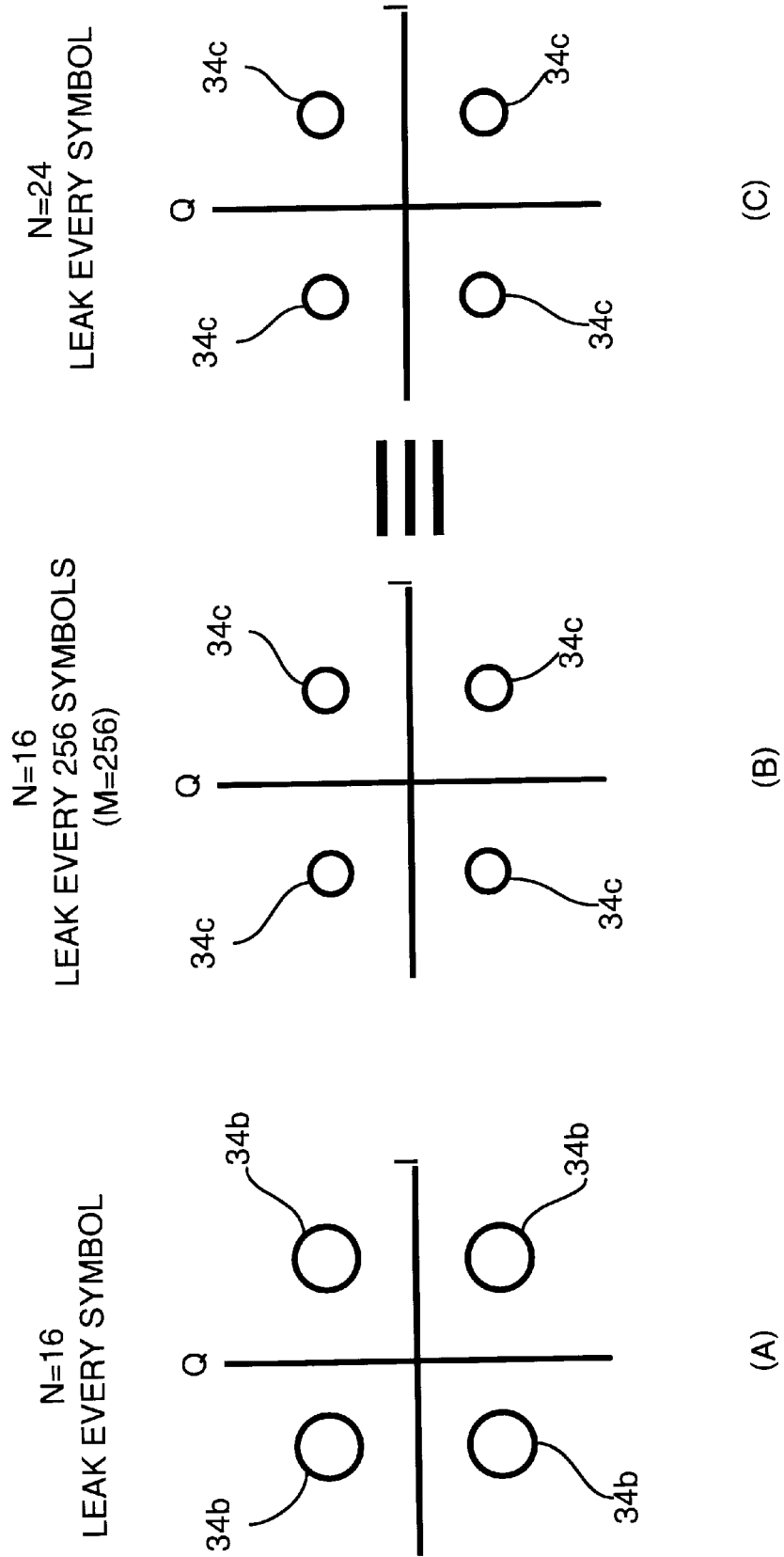
FIG. 5 represent a series of 4 QAM constellation maps (I versus Q) illustrating (A) a converged constellation where 16 bit filter coefficients are leaked every symbol according to the prior art; (B) a converged constellation where 16 bit filter coefficients are leaked every 256 symbols according to an embodiment of the present invention; and (C) a converged constellation that is equivalent to the constellation of (B) where 24 bit filter coefficients are leaked every symbol to illustrate an equivalency effect of the present invention.

This equivalency relationship is illustrated in the constellation maps of FIG. 5. By leaking 1 LSB at every symbol (constellation map A) the equalizer 10 is moving away from the ideal converged values by several LSBs. The continuing update process (Eqs. 3 and 4) may slowly bring the coefficients back to a correct value, but this is a long-term process. Instantaneously, the deviations of the filter coefficients from their ideal values (see map (A) FIG. 3) cause some level of distortion, which blurs the constellation slightly.

The more bits the filter coefficients have, the smaller the LSB, therefore the smaller the distortion as illustrated in map (C) of FIG. 5. Equivalently, according to the leakage method of the present invention, introduced distortion can be minimized by maintaining the same number of bits for the filter coefficients, but leak them less often—i.e. every M symbols as illustrated by map (B) of FIG. 5.

Map (A) illustrates traditional every symbol leakage of 16 bit (N=16) filter coefficients. The resulting introduced distortion, represented by larger diameter points 34b, is reduced by (a) increasing the filter coefficients to 24 bit (N=24) as illustrated by the reduced points 34c of Map (C) or, equivalently, by (b) maintaining 16 bit filter coefficients but performing the leakage every 256 symbols (M=256).

The coefficient leakage of the filter coefficients is performed once every M symbols, where M is a programmable integer variable of value greater than one. The resulting leakage rate is M times smaller than the baud rate or the normal coefficient update rate. Table A1 provides a list of sample values of M and the corresponding leakage rate for an equalizer operating at a given baud rate.

TABLE A1

| BAUD RATE | 160,000 symbols/s |
|---|---|
| SYMBOL RATE | 1/160,000 = 6.3 $\mu s$ |

| M | TIME INTERVAL BETWEEN FILTER COEFFICIENT LEAKS (LEAKAGE RATE) |
|---|---|
| 2 | 12.6 $\mu s$ |
| 4 | 25.2 $\mu s$ |
| 8 | 50.4 $\mu s$ |
| 16 | 100.8 $\mu s$ |
| 32 | 201.6 $\mu s$ |
| 64 | 403.2 $\mu s$ |
| 128 | 806.4 $\mu s$ |
| 256 | 1612.8 $\mu s$ |
| 512 | 3225.6 $\mu s$ |
| 1024 | 6451.2 $\mu s$ |

The coefficient leakage is performed by subtracting energy (i.e. truncation to zero) from the filter coefficients as discussed above. The value of M is chosen based on the adaptation rates ($\mu_f$ and $\mu_b$) of the forward and feedback filters 14 and 20. (i.e. higher $\mu_f/\mu_b$=smaller M), but in general it is set to the maximum possible value so that the equalizer 10 is stable in the long term and the introduced distortion is minimized. It is possible to leak only a subset of filter coefficients during the leakage function. Specific examples illustrating the coefficient leakage method of the present invention are provided below.

EXAMPLE 1

Equalizer
   (a) Forward filter 14: 48 tap coefficients $C_{fi}$ each 24 bits wide
   (b) Feedback filter 20: 48 tap coefficients $C_{bi}$ each 24 bits wide
   (c) Baud Rate: 160K
   (d) Symbol Rate (sr): 1/160K=6.3 $\mu s$
   (e) Leakage: M=512

Figure 4B:
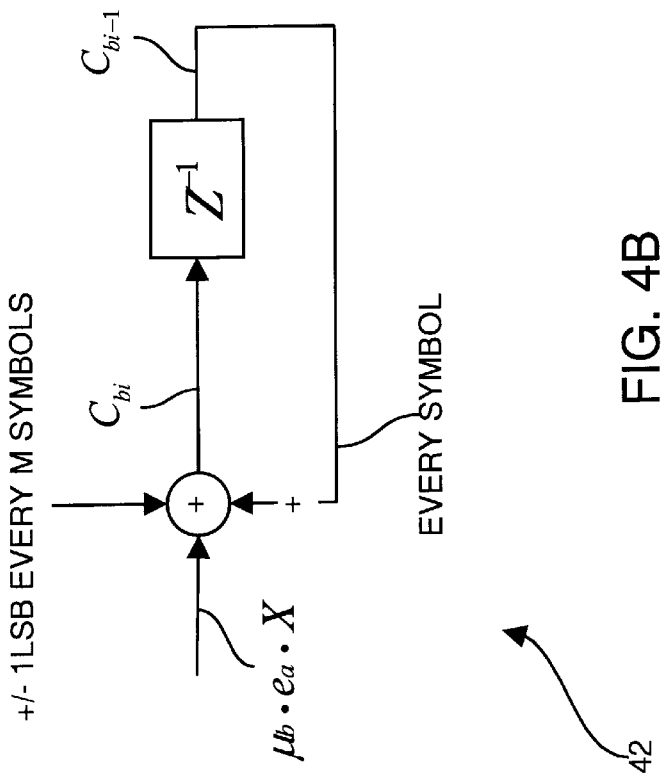
FIG. 4B illustrates a block diagram of the feedback filter coefficient update method during steady state operation according to the present invention.
Figure 4A:
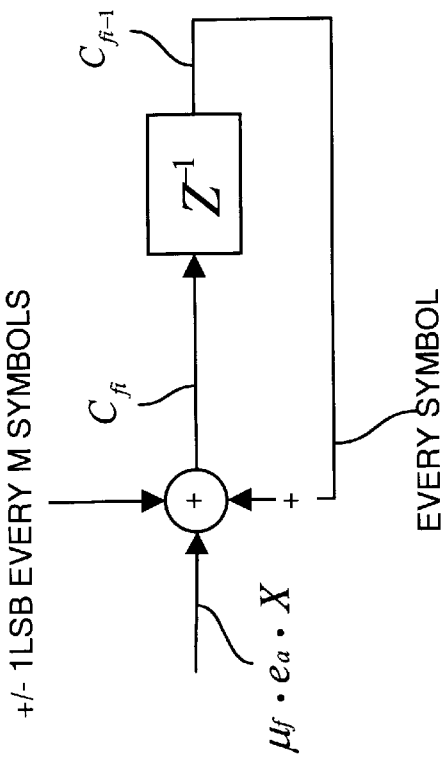
FIG. 4A illustrates a block diagram of the forward filter coefficient update method during steady state operation according to the present invention.

Steady State Operation (after equalizer 10 convergence)
   (1) Modify the forward filter coefficients according to the block diagram 40 of FIG. 4A:
     (a) Update 48 tap coefficients of forward filter 14 using equation Eq. 3 every 6 $\mu s$.

(b) Leak 48 tap coefficients of forward filter 14 using equation Eq. 5 every 3225.6 μs (Mxsr) (i.e. less frequently than the symbol rate of 6 μs).

(2) Modify the feedback filter coefficients according to the block diagram 42 of FIG. 4B:

(a) Update 48 tap coefficients of feedback filter 14 using equation Eq. 4 every 6 μs.

(b) Leak 48 tap coefficients of feedback filter 14 using equation Eq. 6 every 3225.6 μs (Mxsr) (i.e. less frequently than the symbol rate of 6 μs).

EXAMPLE 2

Equalizer (a) Forward filter 14: 48 tap coefficients $C_{fi}$ each 24 bits wide (b) Feedback filter 20: 48 tap coefficients $C_{bi}$ each 24 bits wide (c) Baud Rate: 160K (d) Symbol Rate (sr): $\frac{1}{160}K = 6.3$ μs (e) Leakage: M=16

Steady State Operation (after equalizer 10 convergence)

(1) Modify the forward filter coefficients according to the block diagram 40 of FIG. 4A:

(a) Update 48 tap coefficients of forward filter 14 using equation Eq. 3 every 6 μs.

(b) Leak a first subset of 24 tap coefficients of forward filter 14 using equation Eq. 5 every 100.8 μs (Mxsr) then leak a second subset of 24 tap coefficients of forward filter 14 during the next leakage interval (i.e. after another 100.8 μs). In this way, all 48 tap coefficients will be updated every 2M symbols (i.e. in 201.6 μs).

(2) Modify the feedback filter coefficients according to the block diagram 42 of FIG. 4B:

(a) Update 48 tap coefficients of feedback filter 14 using equation Eq. 4 every 6 μs.

(b) Leak a first subset of 24 tap coefficients of feedback filter 14 using equation Eq. 6 every 100.8 μs (Mxsr) then leak a second subset of 24 tap coefficients of feedback filter 14 during the next leakage interval (i.e. after another 100.8 μs). In this way, all 48 tap coefficients will be updated every 2M symbols (i.e. in 201.6 μs).

Although, the practical range of M in both examples is between 16 and 512, the broadest operable range for a given equalizer can be much large than 16 to 512 (such as from 2 to 1024 and higher) since the range of M depends on adaptation rate $\mu_f/\mu_b$, the number of bits in the coefficients, the number of bits in the data being transmitted/received, etc.

What is claimed is:

1. A method of reducing leakage noise introduced to an equalizer during steady state operation, said equalizer having a forward filter represented by a plurality of tap coefficients and a feedback filter represented by a plurality of tap coefficients, said forward and feedback tap coefficients being updated at a symbol rate during steady state operation, the method comprising the steps of:

(a) reducing the absolute value of one of the updated tap coefficients of the forward filter;

(b) reducing the absolute value of one of the updated tap coefficients of the feedback filter; and (c) repeating steps (a) and (b) at a prescribed rate that is less than the symbol rate and respectively dependent on an adaptation rate of the forward filter and an adaptation rate of the feedback filter.

2. The method of claim 1, wherein step (a) is characterised by:

$$C_{fi} = C_{fi} - \Delta \cdot \text{sign}(C_{fi})$$

where $C_{fi}$ represents the tap coefficients of the forward filter and $\Delta = 1$ least significant bit.

3. The method of claim 2, wherein step (b) is characterised by:

$$C_{bi} = C_{bi} - \Delta \cdot \text{sign}(C_{bi})$$

where $C_{bi}$ represents the tap coefficients of the feedback filter and $\Delta = 1$ least significant bit.

4. The method of claim 3, wherein the update of the tap coefficients of the forward filter is characterised by:

$$C_{fi} = C_{fi-1} + (\mu_f)(e_a)(X)$$

where $\mu_f$ represents a forward filter adaptation rate, $e_a$ represents equalizer output error, and X represents an input signal to the equalizer.

5. The method of claim 4, wherein the update of the tap coefficients of the feedback filter is characterised by:

$$C_{bi} = C_{bi-1} + (\mu_b)(e_a)(X)$$

where $\mu_b$ represents a feedback filter adaptation rate, $e_a$ represents equalizer output error, and X represents an input signal to the equalizer.

6. A method of reducing leakage noise introduced to an equalizer during steady state operation, said equalizer having a forward filter represented by a plurality of tap coefficients and a feedback filter represented by a plurality of tap coefficients, said forward and feedback tap coefficients being updated at a symbol rate during steady state operation, the method comprising the steps of:

(a) reducing the absolute value of the updated tap coefficients of the forward filter;

(b) reducing the absolute value of the updated tap coefficients of the feedback filter; and (c) repeating steps (a) and (b) less frequently than the symbol rate in respective dependence on an adaptation rate of the forward filter and an adaptation rate of the feedback filter.

7. The method of claim 6, wherein step (a) includes the step of subtracting one least significant bit from the magnitude of each of the updated tap coefficients of the forward filter when the updated tap coefficient is positive.

8. The method of claim 6, wherein step (a) includes the step of adding one least significant bit to the magnitude of each of the updated tap coefficients of the forward filter when the updated tap coefficient is negative.

9. The method of claim 7 or 8, wherein step (b) includes the step of subtracting one least significant bit from the magnitude of each of the updated tap coefficients of the feedback filter when the updated tap coefficient is positive.

10. The method of claim 7 or 8, wherein step (b) includes the step of adding a least significant bit to the updated tap coefficients of the feedback filter when the updated tap coefficient is negative.

11. A method of reducing leakage noise introduced to an equalizer during steady state operation, said equalizer having a filter represented by a plurality of N-bit tap coefficients, said tap coefficients being updated at a symbol rate during steady state operation, the method comprising the steps of:

(a) leaking the magnitude of the tap coefficients of the filter by one least significant bit; and (b) repeating step (a) once every M symbols where M is an integer greater than one, the value of M being dependent on an adaptation rate of the filter.

12. The method of claim 11, wherein step (a) includes the step of subtracting one least significant bit from the magnitude of the tap coefficients when the tap coefficient is positive.

13. The method of claim 11, wherein step (a) includes the step of adding one least significant bit to the magnitude of the tap coefficients when the tap coefficient is negative.

14. A method of leaking an N-bit tap coefficient of a filter in an equalizer during steady state operation operating at a symbol rate, the method comprising:

(a) leaking one least significant bit of the tap coefficient which introduces noise; and (b) repeating step (a) less frequently than the symbol rate by a factor of M to reduce the noise of step (a) at a level of an $N+\log_2 M$ bit coefficient, where the value of M is dependent on an adaptation rate of the filter.

15. The method of claim 14, wherein step (a) includes the step of subtracting one least significant bit from the magnitude of the tap coefficient when the tap coefficient is positive.

16. The method of claim 14, wherein step (a) includes the step of adding one least significant bit to the magnitude of the tap coefficients when the tap coefficient is negative.

17. The method of claim 15 or 16, wherein N=24 and M is between 2 and 512.

* * * * *